(12) United States Patent
Van Schaijk et al.

(10) Patent No.: US 8,097,483 B2
(45) Date of Patent: Jan. 17, 2012

(54) MANUFACTURING A MEMS ELEMENT HAVING CANTILEVER AND CAVITY ON A SUBSTRATE

(75) Inventors: Robertus T. F. Van Schaijk, Eindhoven (NL); Piebe Anne Zijlstra, Middelaar (NL); Ronald Koster, Wijchen (NL); Pieter Simon Van Dijk, Renkum (NL)

(73) Assignee: Epcos AG, Munich (DE)

( * ) Notice: Subject to any disclaimer, the term of this patent is extended or adjusted under 35 U.S.C. 154(b) by 0 days.

(21) Appl. No.: 12/682,000

(22) PCT Filed: Oct. 15, 2008

(86) PCT No.: PCT/EP2008/063897
§ 371 (c)(1),
(2), (4) Date: Jul. 8, 2010

(87) PCT Pub. No.: WO2009/050209
PCT Pub. Date: Apr. 23, 2009

(65) Prior Publication Data
US 2010/0264498 A1    Oct. 21, 2010

(30) Foreign Application Priority Data
Oct. 15, 2007   (EP) .................................... 07118429

(51) Int. Cl.
*H01L 21/00*   (2006.01)
(52) U.S. Cl. ............... 438/52; 205/50; 257/415
(58) Field of Classification Search ............ 257/415; 438/52; 205/50
See application file for complete search history.

(56) References Cited

U.S. PATENT DOCUMENTS

| 4,436,766 | A | * | 3/1984 | Williams ................. 204/192.17 |
| 5,605,614 | A | | 2/1997 | Bornand |
| 7,256,467 | B2 | * | 8/2007 | Reid et al. ...................... 257/415 |
| 7,696,587 | B2 | * | 4/2010 | Watanabe et al. ............. 257/415 |
| 7,728,395 | B2 | * | 6/2010 | Yang et al. .................... 257/415 |
| 7,821,010 | B2 | * | 10/2010 | Pan et al. ........................ 257/72 |
| 2002/0008296 | A1 | * | 1/2002 | Chan et al. .................... 257/415 |
| 2002/0047172 | A1 | * | 4/2002 | Reid ............................. 257/415 |
| 2003/0010746 | A1 | * | 1/2003 | Gutierrez et al. ................ 216/2 |

(Continued)

OTHER PUBLICATIONS

Duffy, S. "MEMS microswitches for reconfigurable microwave circuitry" IEEE Micro. And Wire. Comp. Lett. vol. 11, No. 3 Mar. 2001 pp. 106-108.*
Written Opinion corresponding to International Patent Application No. PCT/EP2008/063897, European Patent Office, dated Jul. 22, 2009, 5 pages.
International Search Report corresponding to International Patent Application No. PCT/EP2008/063897, European Patent Office, dated Jul. 22, 2009, 3 pages.

*Primary Examiner* — N Drew Richards
*Assistant Examiner* — Grant Withers
(74) *Attorney, Agent, or Firm* — Nixon Peabody LLP (57) ABSTRACT

Method for manufacturing a capacitor on a substrate, the capacitor including a first electrode (5) and a second electrode (12; 25), the first and second electrodes being separated by a cavity (16; 32), the substrate including an insulating surface layer (3), the first electrode (5) being arranged on the insulating surface layer a first metal body (7a; 20) being adjacent to the first electrode and arranged as anchor of the second electrode (12; 25) the second electrode being arranged as a beam-shaped body (12; 25) located on the first metal body and above the first electrode; the cavity (16; 32) being laterally demarcated by a sidewall of the first metal body.

22 Claims, 5 Drawing Sheets

U.S. PATENT DOCUMENTS

| | | | |
|---|---|---|---|
| 2003/0036215 A1* | 2/2003 | Reid | 438/52 |
| 2003/0119221 A1* | 6/2003 | Cunningham et al. | 438/52 |
| 2003/0222321 A1* | 12/2003 | Yang et al. | 257/415 |
| 2004/0000696 A1* | 1/2004 | Ma et al. | 257/415 |
| 2005/0048687 A1* | 3/2005 | Tatic-Lucic | 438/48 |
| 2005/0054134 A1* | 3/2005 | Frey et al. | 438/50 |
| 2006/0076634 A1* | 4/2006 | Palmateer et al. | 257/415 |
| 2007/0178703 A1* | 8/2007 | Partridge et al. | 438/706 |
| 2009/0027763 A1* | 1/2009 | Zhang et al. | 359/320 |
| 2009/0159996 A1* | 6/2009 | Chow et al. | 257/415 |

* cited by examiner

MANUFACTURING A MEMS ELEMENT HAVING CANTILEVER AND CAVITY ON A SUBSTRATE

CROSS-REFERENCE TO RELATED APPLICATIONS

This application is a U.S. National Stage of International Application No. PCT/EP2008/063897, filed Oct. 15, 2008, which claims the benefit of European Patent Application No. 07118429.5, filed on Oct. 15, 2007, both of which are incorporated herein by reference in their entireties.

FIELD OF THE INVENTION

The present invention relates to a method of manufacturing a MEMS element on a substrate and to a MEMS element on a substrate.

BACKGROUND OF THE INVENTION

A MEMS (Micro Electro Mechanical System) Element is a device often operating as a switchable capacitor on a substrate and having a first and a second electrode. A first electrode is configured as a moveable beam that is located above the other electrode which is in a fixed position on a substrate. The two planar electrodes are separated by a cavity. The spacing between the two planar electrodes is variable by an external force exerted on the moveable beam.

Typically, the cavity between the two planar electrodes is manufactured by the use of a sacrificial layer. On the planar electrode on the substrate a first layer is deposited as sacrificial layer and is patterned so as to form a sacrificial body. On the sacrificial body a second layer is deposited. The second layer is patterned to form the body of the moveable beam. Next, the sacrificial body is removed between the moveable beam and the planar electrode on the substrate so as to form the cavity.

A disadvantage of this method is that the step coverage of the second layer on the sacrificial body is relatively poor. Typically, the thickness of the second layer on the lateral edges of the sacrificial body is reduced in comparison to the thickness of the second layer on the substrate and/or on the sacrificial body.

In an example of a switchable capacitor, a typical thickness of the sacrificial layer may be about 3 micrometer while the thickness of the second layer may be about 5 micrometer. At the lateral edges of the sacrificial body the thickness of the second layer may be reduced to about 2-3 micrometer.

As a result, the variation of the thickness of the moveable beam leads to a large spread of the mechanical properties of the beam and of the MEMS device that comprises the switchable capacitor.

SUMMARY OF THE INVENTION

It is an object of the present invention to provide a method of manufacturing a switchable capacitor which overcomes the disadvantage of the prior art.

This is achieved in the method according to claim 1. By using the method, the step coverage of the third metal layer over the second metal body is improved by arranging the portion of reduced thickness in the metal-3 layer to an area 'beyond the anchor'. Advantageously, the beam-shaped second electrode now has a substantially constant thickness which allows the creation of switchable capacitors with better defined properties with relatively low spread.

In a further embodiment the second metal layer comprises aluminum or an aluminum alloy. The first and second metal bodies are created by:
  oxidizing the surface of the second metal layer to form an oxidized surface;
  applying a patterning mask on the oxidized surface, such that a first mask portion and second mask portion are located over and cover areas of the second metal layer where the first and second metal body are to be created;
  anodizing the second metal layer in areas not covered by the first and second mask portions, causing the first and second metal bodies to be enveloped at their respective side walls and top surface by anodized metal and causing the intermediate separation to comprise anodized metal.

Advantageously, since the third metal layer can be deposited on a substantially flat surface layer that comprises the first and second aluminum bodies embedded in aluminum-oxide layer, the step coverage of the second aluminum layer is not an issue and the thickness of the second aluminum layer is substantially constant over the area of the first and second metal bodies. Moreover, since both first and second metal bodies in this embodiment have substantially flat top surfaces, the third metal layer will be substantially flat as well.

In yet a further embodiment, the intermediate separation of the first and second metal bodies is a trench formed by anisotropic etching of the second metal layer.

Advantageously, the dimension of the trench allows that the third metal layer can be deposited as a layer that at least bridges the trench. Since the third metal layer can be deposited on a substantially flat surface comprising the first and second bodies with the trench in between them, step coverage of the third metal layer is not an issue and the thickness of the third metal layer is substantially constant.

In a still further embodiment, the method comprises the deposition of a second protective layer covering at least the first and second metal bodies prior to the deposition of the third metal layer. Advantageously, due to the presence of the second protective layer the etching process to remove the second metal body defined in the second metal layer is not time-critical. As a result, the dimension of the cavity after etching is well defined, without variation due to etching.

The invention further relates to a MEMS element that may be created with the method of the invention. Herein, a first metal body is arranged adjacent to the first electrode as anchor of the second electrode, the second electrode being arranged as a beam-shaped body located on the first metal body and above the first electrode; the cavity being laterally demarcated by a sidewall of the first metal body.

BRIEF DESCRIPTION OF DRAWINGS

Below, the invention will be explained with reference to some drawings, which are intended for illustration purposes only and not as a limitation of the scope of protection as defined in the accompanying claims.

DETAILED DESCRIPTION OF THE EMBODIMENTS

Figure 1:
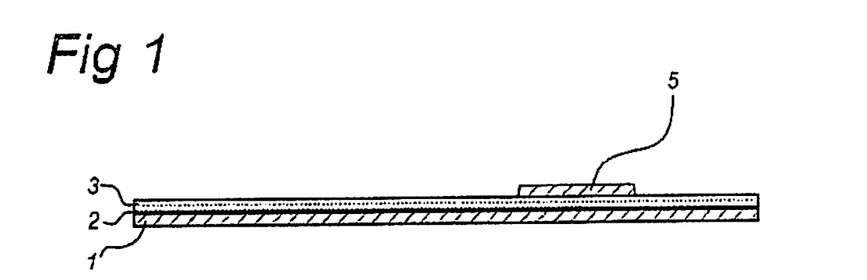
FIG. 1 shows a cross-section view of a substrate during manufacture of a MEMS element after a basic step.

FIG. 1 shows a cross-section view of a MEMS device during manufacture of a switchable capacitor after a basic step. This basic step is a common step that prepares the surface of the substrate. On a semiconductor substrate 1, for example a silicon wafer, a silicon dioxide layer 2 is formed by thermal oxidation. Alternatively, a dielectric substrate comprising silicon dioxide or a glassy material may be used. Then, if required, an Ar-ion implantation may be carried out to implant Ar into the wafer 1 so as to increase the resistance against possible coupling of RF-signals in the device to be built. Next, a silicon nitride layer 3 is formed on top of the silicon dioxide layer 2, for example by plasma enhanced chemical vapor deposition (PECVD). On the silicon nitride layer 3, a metal layer is deposited and patterned to form a first or lower electrode 5. For example, the thickness of the silicon dioxide layer 2 is about 100 nm, the thickness of the silicon nitride layer 3 is about 400 nm. The first or lower electrode 5 has a thickness of about 400-500 nm and may comprise aluminum or an aluminum alloy (such as Al—Cu or Al—Si).

Figure 2:
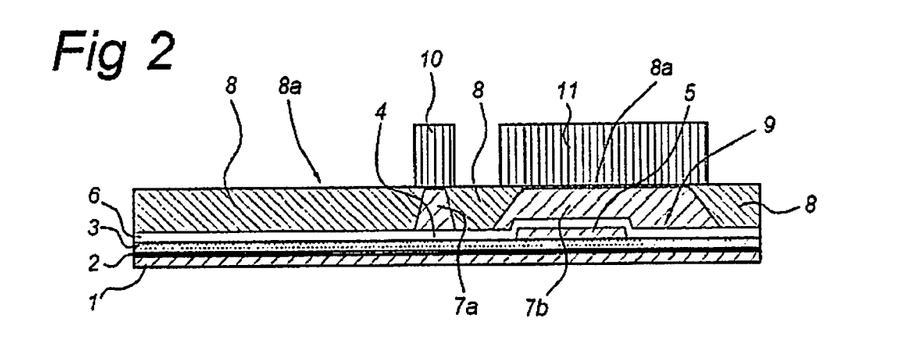
FIGS. 2-4 show cross-section views of the MEMS element in subsequent stages according to the first embodiment of the method.

FIG. 2 shows a cross-section view of the switchable capacitor in a next stage after the basic step in accordance with a first embodiment of the method. On the first electrode 5 and the silicon nitride layer 3 a dielectric layer 6 is deposited. The dielectric layer may comprise a PECVD silicon nitride layer. The dielectric layer 6 may have a thickness of about 400-500 nm. Subsequently, a thin layer of Hafnium is deposited (not shown), covering the dielectric layer 6. Then, a layer of aluminum (alloy) is deposited. The aluminum layer is oxidized in such a way that a top surface 8a of aluminum-oxide ($Al_2O_3$) is formed. For example, the Hafnium layer has a thickness of about 15 nm, the aluminum layer has a thickness of about 3 micrometer and the thickness of the aluminum-oxide top surface 8a is about 100-200 nm.

In a successive step, a resist mask pattern is applied on the aluminum-oxide top surface 8a. The pattern of the resist mask comprises a mask portion 10 that is located substantially above an anchor location 4 and a second mask portion 11 that is located substantially above the first electrode 5 and also extends over an adjacent region 9 next to the first electrode 5. The anchor location 4 is arranged as the location where an anchor of an upper electrode to be formed, will be located.

In a following step, the aluminum layer 7/aluminum-oxide top surface 8a that is not covered by the mask portions 10, 11 is anodized to form an aluminum-oxide layer 8. On the locations covered by the mask portions, the aluminum layer remains as a first aluminum body 7a above the anchor location 4, and as a second aluminum body 7b above the first electrode 5 and the adjacent region 9. Both the first and second aluminum bodies 7a, 7b are entrapped in a shell of aluminum oxide that abuts the side walls and the top surface of each body. The lower surface of each body abuts the dielectric layer 6.

Figure 3:
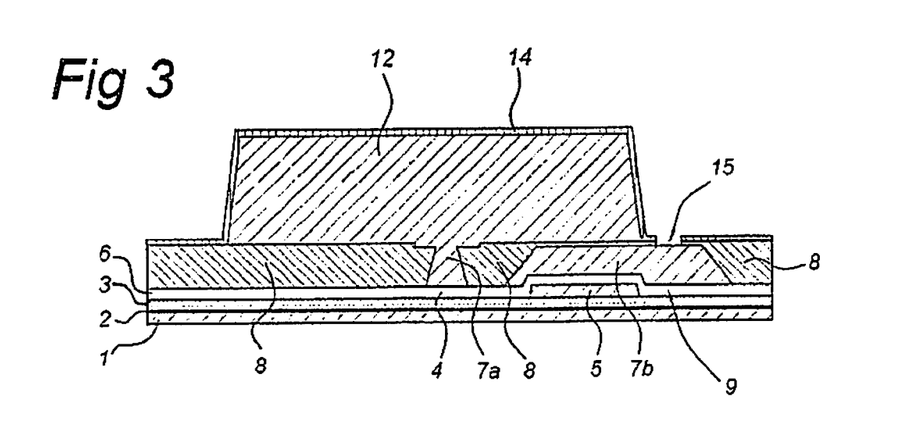

FIG. 3 shows a cross-section view of the MEMS element after a subsequent stage according to a first embodiment of the method. Next, the resist mask pattern is removed. A contact etch is carried out by etching away the aluminum-oxide layer above the anchor location 4 to the extent that the anchor location 4 is exposed. The second aluminum body 7b remains covered by the thin aluminum-oxide layer. Then, a second aluminum layer is deposited and patterned to form a aluminum beam-shaped body 12. For example, the thickness of the second aluminum layer is about 5 micrometer. The first and second metal bodies 7a, 7b are arranged as mesas adjacent to each other. On the first and second metal bodies 7a, 7b the second aluminum layer is deposited. Since both first and second metal bodies 7a, 7b have substantially flat top surfaces, the second aluminum layer will be substantially flat as well. Advantageously, since the second aluminum layer can be deposited on a substantially flat surface layer that comprises the first and second aluminum bodies 7a, 7b embedded in aluminum-oxide layer 8, the step coverage of the second aluminum layer is not an issue and the thickness of the second aluminum layer is substantially constant over the area of the first and second metal bodies 7a, 7b.

After the step of patterning the second aluminum layer into the aluminum beam-shaped body 12, a first protective layer, i.e., a protective silicon dioxide layer 14, is formed on the aluminum beam-shaped body 12 by either deposition or oxidation of the aluminum beam-shaped body 12. In a successive step, one or more openings 15 to the second aluminum body 7b are made in the oxide layer above the adjacent region 9 of the first electrode 5.

Figure 4:
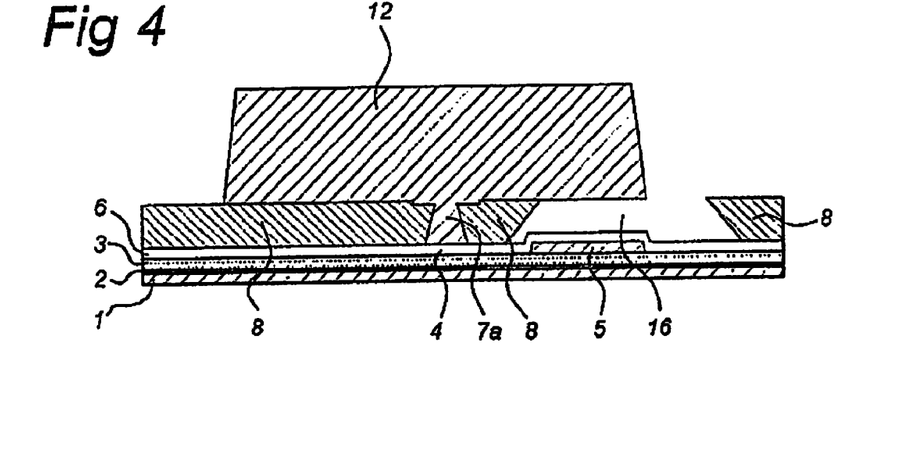

FIG. 4 shows a cross-section view of the switchable capacitor after a further stage according to a first embodiment of the method. A sacrificial etch, selective to oxide, is carried out to remove the second aluminum body 7b through the one or more openings 15. A cavity 16 is formed by the sacrificial etch. Since the second aluminum body 7b is embedded in the aluminum oxide layer 8 and the dielectric layer 6 which jointly act as border of the cavity 16 (to be formed), the etching process is not time-critical. As a result, the dimension of the cavity 16 after etching is well defined, irrespective of any variation of the etching process. Next, the protective silicon dioxide layer 14 is removed by selective second etching. As a result, a MEMS element is obtained that comprises the aluminum beam-shaped body 12 as a moveable beam-shaped electrode 12 and the first electrode 5 as fixed lower electrode 5. In between the moveable beam-shaped upper electrode 12 and the fixed lower electrode 5 the cavity 16 is located. The moveable beam-shaped electrode 12 is located on the first metal body and above the first electrode. The cavity 16 is laterally demarcated by a sidewall of the first metal body. The height of the cavity 16 is substantially equal to the height of the first metal body 7a.

Figure 5:
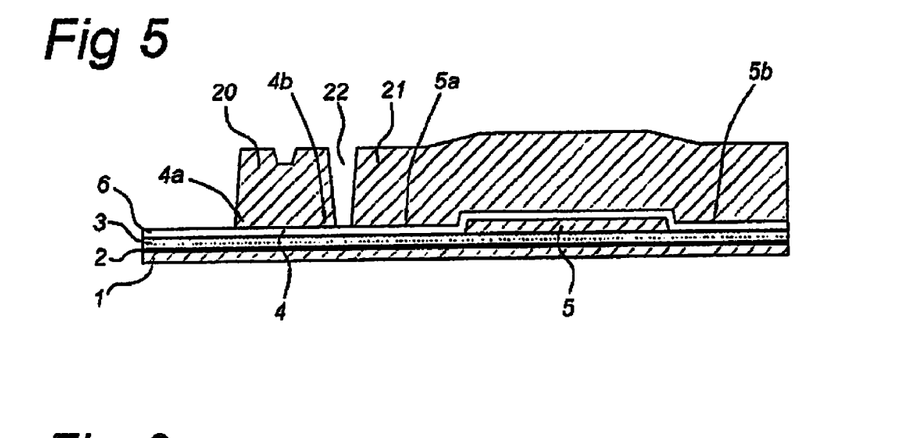
FIGS. 5-10 show cross-section views of the MEMS element in subsequent stages after the basic step of FIG. 1 according to the second embodiment of the method.

FIG. 5 shows a cross-section view of the switchable capacitor in a next stage after the basic step (FIG. 1) in accordance with a second embodiment of the method. On the first electrode 5 and the silicon nitride layer 3 a dielectric layer 6 is deposited. The dielectric layer may comprise a PECVD silicon nitride layer. The dielectric layer 6 may have a thickness of about 400-500 nm. Then, a layer of metal 7 e.g., aluminum (alloy), is deposited as a second metal layer 7. For example, the second metal layer 7 may be aluminum. The second metal layer 7 may have a thickness of about 3 micrometer. Alternatively, the second metal layer 7 may be replaced by another material such as amorphous silicon.

In a successive step, a resist mask pattern is applied on the second metal layer 7. The second metal layer 7 is subsequently patterned by anisotropic etching in such a way that a first metal body 20 is created substantially above a contact location 4 and a second metal body 21 is created substantially above the first electrode 5 and also extends over adjacent regions 5a, 5b next to the first electrode 5. Anchor location 4 is arranged as the location where an anchor of an upper electrode to be formed, will be located.

In some embodiments, anchor location 4 may be used as electric contact of the upper electrode (to be formed in a later process step). The first metal body 20 and the second metal body 21 are separated from each other by a trench or gap 22.

Preferably, the trench is designed to have a width substantially equal to the minimal feature size that can be obtained by the lithographic process.

Figure 6:
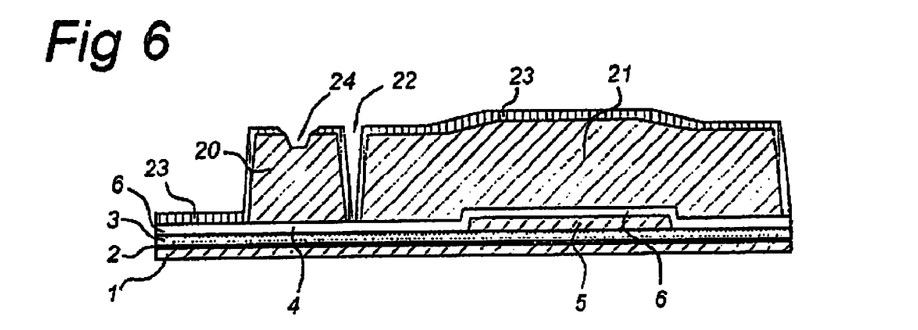

FIG. 6 shows a cross-section view of the switchable capacitor in a further stage in accordance with a second embodiment of the method. As second protective layer a dielectric layer such as a silicon dioxide layer 23 is deposited over the first and second metal bodies 20, 21. The deposition may be by means of a plasma enhanced chemical deposition process. Alternatively, the deposition of the silicon dioxide layer 23 is by means of a spin-on-glass process followed by an etch-back process. In the latter case, the trench 22 may be filled by silicon dioxide. After deposition of silicon dioxide layer 23, in case that the anchor location is used as electric contact for the upper electrode, a contact etch (a lithographic process) is carried out to create an opening 24 in the silicon dioxide layer 23 to the first metal-2 body 20 covering the anchor location 4.

Figure 7:
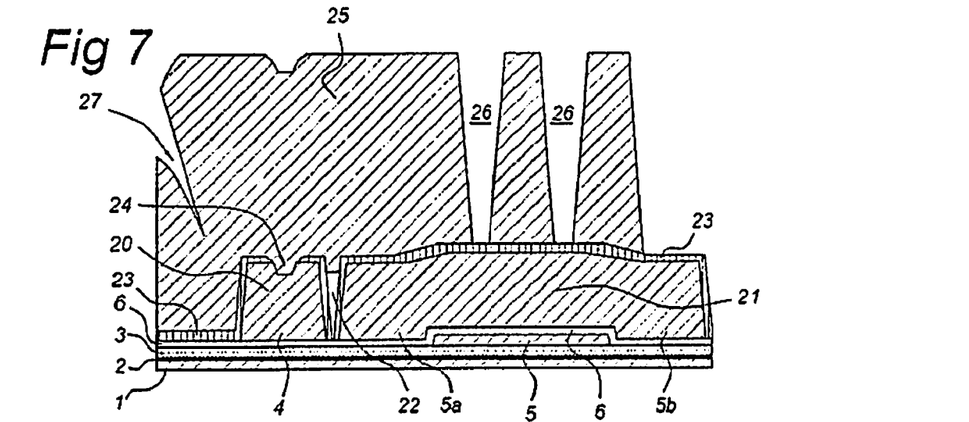

FIG. 7 shows a cross-section view of the MEMS element in a still further stage in accordance with a second embodiment of the method. A third metal layer 25 is deposited over the structure shown in FIG. 6. For example, the third metal layer comprises aluminum or an aluminum alloy. The thickness of the third metal layer may be about 5 micrometer. Advantageously, since the third metal layer 25 can be deposited on a substantially flat surface comprising the first and second metal bodies 20, 21, the step coverage of the third metal layer is not an issue and the thickness of the metal-3 layer is substantially constant.

Note that the dimension of the trench 22 and the parameters of the deposition process are chosen in such a way that the metal-3 layer is deposited as a layer that at least bridges the trench 22. Also, the trench 22 may be filled at least partially by the third metal layer 25, depending on the deposition parameters of the third metal deposition and the dimensions of the trench 22. The filling effect can be insignificant when the width of the trench 22 is smaller than the thickness of the third metal layer 25. Under this condition no step is formed in metal layer 25. In case that the trench 22 was filled by silicon dioxide 23 by a spin-on-glass process as described above (see FIG. 6), the third metal layer 25 will extend substantially flat over both the first metal body 20 and the second metal body 21. The third metal layer 25 is patterned to form a moveable beam-shaped electrode extending over the second metal body 21. Also, one or more openings 26 to the silicon dioxide layer 23 covering the second metal-2 portion 21 are formed. (As an illustration two openings are shown here). The width of the openings 26 is relatively smaller than the thickness of the third metal layer 25. The effect of possible insufficient step coverage is shown as a constriction 27 at the edge of the first metal body facing away from the second metal body.

Figure 8:
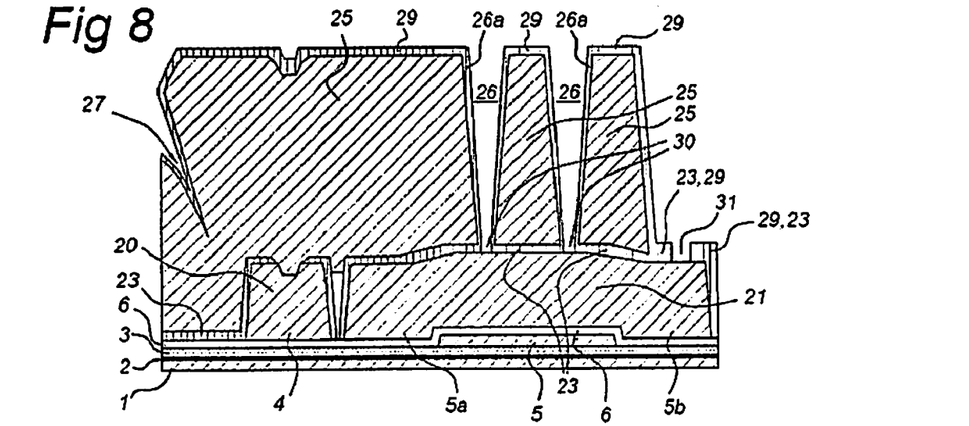

FIG. 8 shows a cross-section view of the MEMS element in yet a further stage in accordance with a second embodiment of the method. After creation of the one or more openings 26, a further silicon dioxide layer 29 is deposited as a third protective layer. The further silicon dioxide layer 29 may be deposited by means of plasma enhanced chemical vapor deposition. Using this type of deposition process the sidewalls 26a of the one or more openings 26 can be covered with silicon dioxide over their complete depth. In a next step, a window etch is carried out to expose the second metal body 21 at the bottom 30 of the one or more openings 26 that abut the second metal body 21. Also, one or more additional openings 31 to the second metal body 21 are etched in the silicon dioxide covering a region of the second metal body 21 that is not covered by the patterned third metal layer 25.

Figure 9:
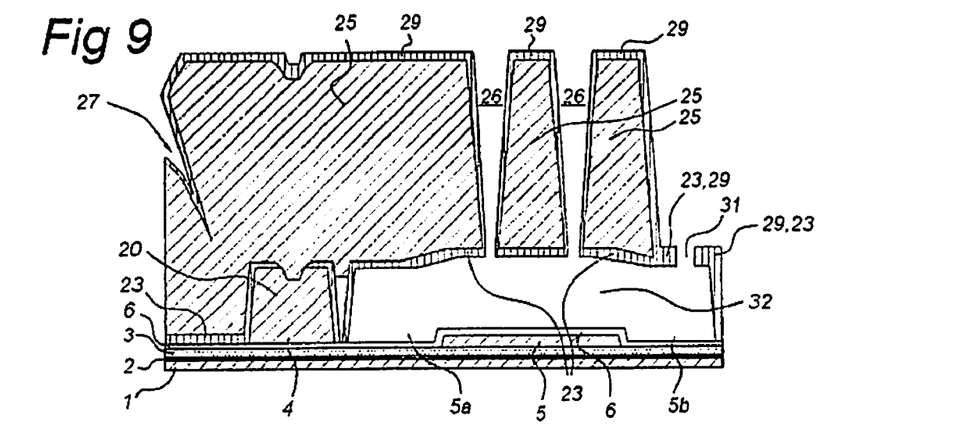

FIG. 9 shows a cross-section view of the switchable capacitor in yet a next stage in accordance with a second embodiment of the method. The second metal body 21 which is a sacrificial body, is removed by a selective etching process to create the cavity 32 between the patterned third metal layer 25 that can act as moveable beam-shaped electrode and the first electrode 5. The layers of silicon dioxide 23, 29 on the walls surrounding the cavity 32, on the patterned third metal layer 25 and on the sidewalls of the one or more openings 26 act to protect the underlying structure against etching during the creation of the cavity 32. Due to the presence of such protective layers the etching process to remove the second metal body 21 is not time-critical. As a result, the dimension of the cavity after etching is well defined, without variation due to etching. The etching of the sacrificial second metal body can be carried out by either a wet etching process or a dry etching process.

Figure 10:
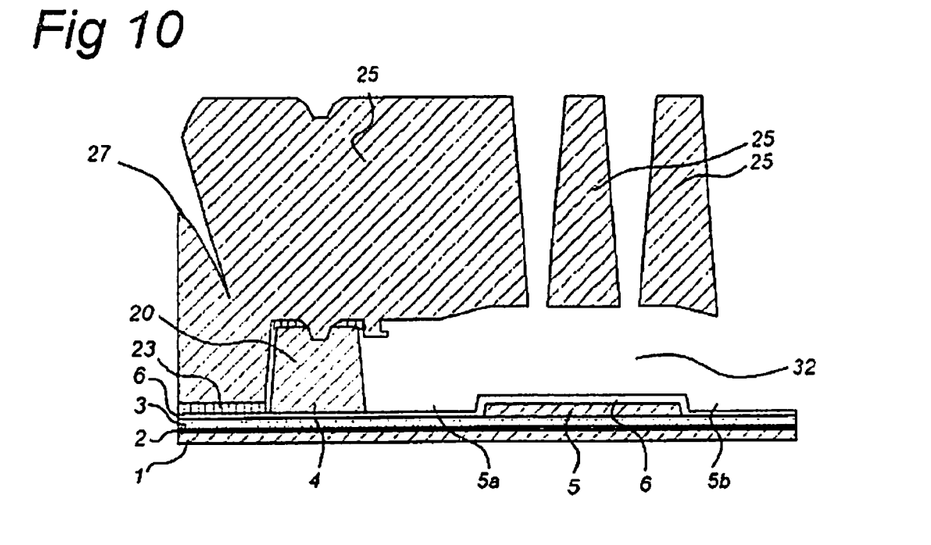

FIG. 10 shows a cross-section of the MEMS element in a final stage according to the second embodiment of the method. In a further step, the silicon dioxide 23, 29 on the walls surrounding the cavity 32, on the patterned third metal layer 25 and on the sidewalls of the one or more openings 26 is removed by a selective etching process that substantially only removes the silicon dioxide. The constriction 27 in the patterned third metal layer 25 is located outside of the area 4a, 4, 4b, 22, 5a, 5, 5b of the first metal body 20, the first electrode 5, and the cavity 32. It will be appreciated that in this manner the constriction 27 has no effect on the mechanical properties of the patterned beam-shaped electrode 25.

By using the method, the step coverage of the second layer over the sacrificial body is improved by arranging the constriction 27 in the third metal layer 25 to an area 'beyond the anchor', i.e., at a side of the first metal body opposite to the side where the first electrode 5 is located. The moveable beam now has a substantially constant thickness which allows the creation of switchable capacitors with better defined properties with relatively low spread. The moveable beam-shaped electrode 25 is located on the first metal body and above the first electrode. The cavity 32 is laterally demarcated by a sidewall of the first metal body.

Figure 11:
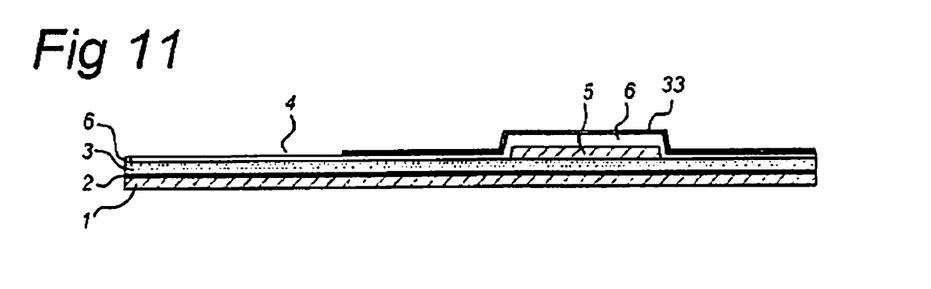
FIGS. 11-15 show cross-section views of the MEMS element in subsequent stages after the basic step of FIG. 1 according to the third embodiment of the method.

FIG. 11 shows a cross-section view of the MEMS element in a next stage after the basic step in accordance with a third embodiment of the method. On the first or lower electrodes 5 and the silicon nitride layer 3 a dielectric layer 6 is deposited. The dielectric layer may comprise a PECVD silicon nitride layer. The dielectric layer 6 may have a thickness of about 400-500 nm. On the dielectric layer 6 a thin TiW (Titanium-Tungsten) layer 33 is deposited. The TiW layer 33 may have a thickness of about 30 nm. Alternatively, the TiW layer may be replaced by a TiN (titanium nitride) layer. In a lithographic step (i.e., applying a resist layer, patterning the resist layer and etching the exposed portions of the TiW and dielectric layers), the TiW layer 33 is removed from the anchor location 4 and the adjacent area 4a, 4b. The TiW layer 33 remains on the dielectric layer 6 that covers the area of the first electrode 5, its adjacent regions 5a, 5b and the area of the trench 22 (to be formed).

Figure 12:
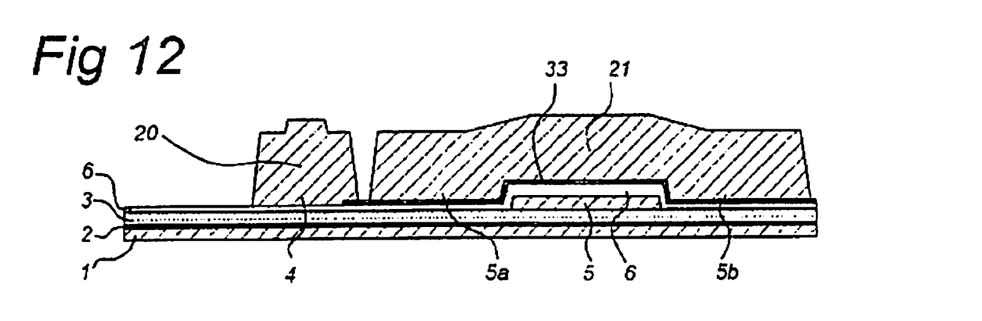

FIG. 12 shows a cross-section view of the MEMS element in a further stage in accordance with a third embodiment of the method. Then, a second metal layer 7 is deposited, for instance of aluminium or an aluminum alloy in a thickness of about 3 micrometer.

In a successive step, a resist mask pattern is applied on the second metal layer 7. The second metal layer 7 is subsequently patterned by anisotropic etching in such a way that a first metal body 20 is created substantially above the anchor location 4 and its adjacent regions 4a, 4b and a second metal body 21 is created substantially above the first electrode 5 and also extends over adjacent regions 5a, 5b next to the first electrode 5. The first metal body 20 and the second metal body 21 are separated from each other by a trench or gap 22. The first and second metal bodies 20, 21 are arranged in such a way that the TiW layer 33 extends under the second metal body 21, the trench 22 and optionally under a part of the first metal body 20.

Figure 13:
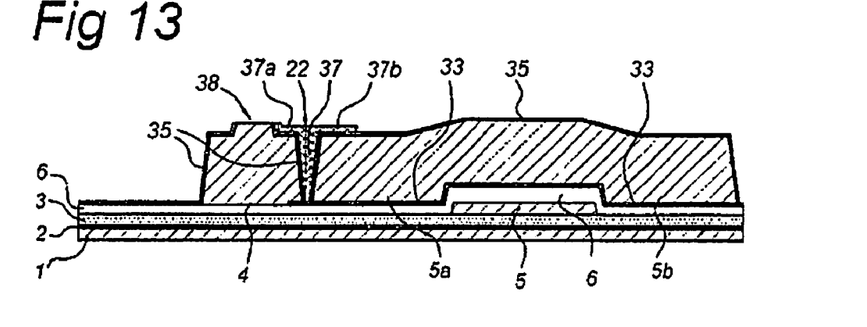

FIG. 13 shows a cross-section view of the MEMS element in a subsequent stage in accordance with a third embodiment of the method. Next, as a second protective layer a second TiW layer 35 is deposited by PECVD on the first and second metal bodies 20, 21. The TiW layer 35 may have a thickness of about 30 nm. Alternatively, TiW may be replaced by TiN, or TiWN or Ta or another barrier layer. The second TiW layer 35 also covers the walls of the trench 22 between the first and second metal bodies 20, 21.

Then, in a preferred embodiment, a W layer 37 is deposited by means of a CVD (Chemical Vapor Deposition) process and covers the second TiW layer 35. By using a suitable deposition process the W layer 37 can be made to fill the trench 22. The W layer 37 may have a thickness of about 300 nm-1 um (outside of the trench, perpendicular to the substrate). Advantageously, the use of W as filling material of the trench 22 appears to improve the mechanical properties of both the anchor (first metal-2 body 20) and the moveable beam-shaped electrode in the switchable capacitor to be formed. In a next step, the W layer 37 is patterned in such a way that the W layer 37 is present in the trench 22 and in a region 37a, 37b adjacent to the trench 22 on top of the first and second metal bodies 20, 21. On the first metal body 20, a contact opening 38 may be created by local removal of the second TiW layer 35. The creation of a contact opening is however not required since TiW is a conductor material with a sufficiently high conductivity.

Figure 14:
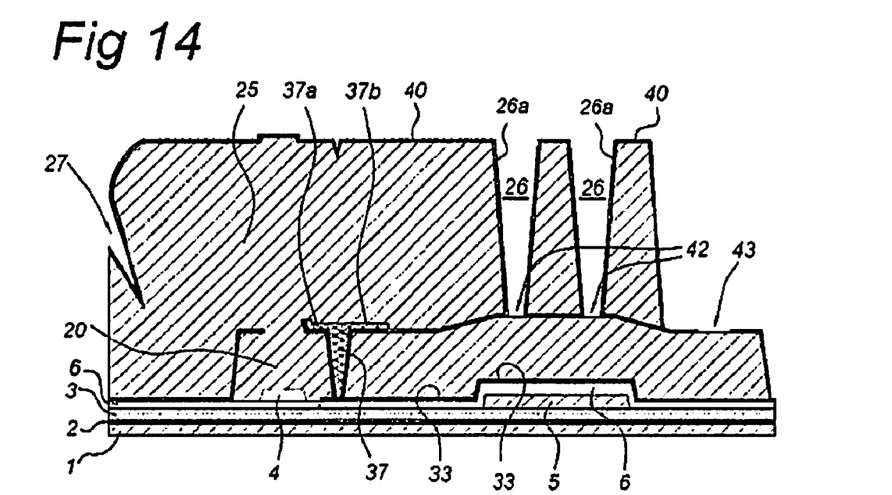

FIG. 14 shows a cross-section view of the MEMS element in yet a further stage in accordance with a third embodiment of the method. Next, a third metal layer 25 is deposited over the structure shown in FIG. 13. For example, the third metal layer comprises aluminum or an aluminum alloy, and has a thickness of about 5 micrometer. Advantageously, since the third metal layer 25 can be deposited on a substantially flat surface comprising the first and second metal bodies 20, 21 covered by the second TiW layer 35 and the patterned W layer 37, 37a, 37b, the step coverage of the third metal layer is not an issue and the thickness of the third metal layer is substantially constant. Note that the third metal layer is deposited in such a way that the trench 22 is bridged.

The third metal layer 25 is patterned to form a moveable beam-shaped electrode extending over the second metal body 21. Also, one or more openings 26 to the silicon dioxide layer 23 covering the second metal body 21 are formed. (As an illustration two openings are shown here). The width of the openings 26 is relatively smaller than the thickness of the third metal layer 25. Then, as third protective layer a third TiW layer 40 is deposited by means of PECVD to cover the patterned third metal layer 25 and the sidewalls 26a of the one or more openings 26 in the third metal layer. Instead of TiW, layer 40 may comprise TiN or another barrier layer. The thickness of the third TiW (or TiN) layer may be about 60 nm. In a further embodiment, the third TiW (or TiN) layer may be covered by an additional dielectric layer, e.g., silicon dioxide. The silicon dioxide layer may enhance the etching resistance during the sacrificial etching. After application of the third TiW layer 40, a selective etch is carried out to open the TiW layer at the bottom 42 of the one or more openings 26. Also, (an) opening(s) 43 in the TiW layer is/are made in a region of the second metal-2 body 21 that is not covered by the patterned third metal layer 25.

Figure 15:
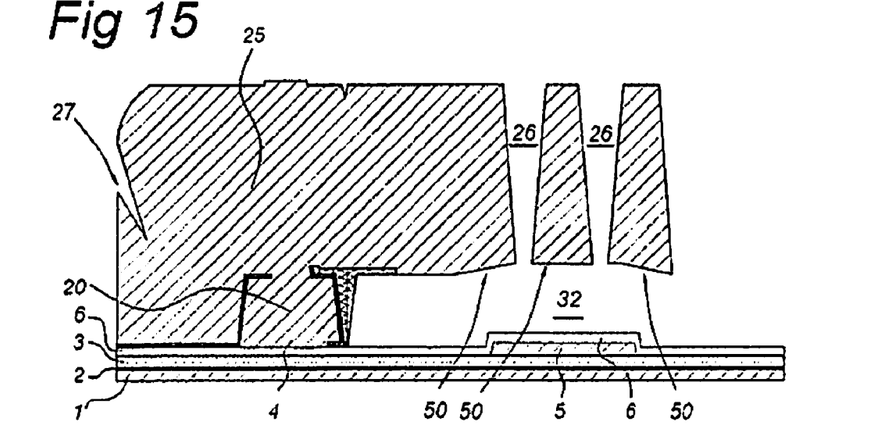

FIG. 15 shows a cross-section of the MEMS element in a final stage according to the third embodiment of the method. The second metal body 21 which is a sacrificial body, is removed by an etching process to create the cavity 32 between the patterned third metal layer 25 that can act as moveable beam-shaped electrode and the second contact electrode 5. The TiW layers 35, 40 on the walls surrounding the cavity 32, on the third metal layer 25 and on the sidewalls of the one or more openings 26 act as protective layers during the creation of the cavity 32. Due to the presence of such protective layers the etching process to remove the second metal body 21 is not time-critical. As a result, the dimension of the cavity 32 after etching is well defined, without variation due to etching. Finally, the TiW layers 35, 40 are removed from the walls surrounding the cavity 32, the patterned third metal layer 25, the sidewalls of the one or more openings 26 and the dielectric layer 6. If the additional dielectric layer is present, it is removed in a selective etching step (e.g., buffered oxide etch if the additional dielectric is silicon dioxide) in which the TiW (or TiN) layer 35, 40 protects the patterned metal 25 against etching. In a later step, the TiW (or TiN) layer may be selectively removed by etching in a solution of $H_2O_2$.

The method according to the third embodiment has the advantage that during the removal of the second metal body 21 the lower surface 50 of the third metal layer (moveable electrode) 25 is protected against corrosion by the etching process due to the presence of the TiW layer. As a result the lower surface 50 is relatively smooth with a reduced variation of the height between the moveable electrode 25 and the first contact electrode (lower electrode) 5. In this manner, the capacitance of the switchable capacitor is better defined with less variation. When the additional dielectric layer is applied on the TiW layer, the smoothness of the lower surface 50 can be relatively improved. The dielectric layer can have a relatively higher resistance against the etchant of the sacrificial body in comparison to the etching resistance of the TiW protective layer. In this case, the additional dielectric layer protects the lower surface 50 of the patterned third metal layer 25 during sacrificial removal of the second sacrificial body 21. Next when the dielectric layer is removed, the TiW layer protects the lower surface 50. Finally, the TiW layer is removed by a highly selective etch.

The moveable beam-shaped electrode 25 is located on the first metal body and above the first electrode. The cavity 32 is laterally demarcated by a sidewall of the first metal body. It is noted that although the W layer 37 can be used advantageously for filling the trench 22 between the first and second metal bodies 20, 21, the application of the W layer may be omitted in case that the third metal layer 25 can be made to bridge the trench.

The invention claimed is:

1. A method for manufacturing a MEMS element on a substrate, the MEMS element comprising a first electrode and a second electrode, the first and second electrodes being separated by a cavity, the substrate comprising an insulating surface layer; wherein the method comprises:
   creating the first electrode on the insulating surface layer;
   creating a first metal body and a second metal body in a second metal layer, the first and second metal bodies being separated from each other by an intermediate separation,
   the first metal body being located above an anchor location, the second metal body being located above at least the first electrode,
   creating as the second electrode a beam-shaped body in a third metal layer located on the first metal body and at least a portion of the second metal body;

creating at least one opening in the third metal layer to the second metal body in an area above the second metal body; and removing the second metal body through the at least one opening so as to create a cavity in the location of the second metal body.

2. The method according to claim 1, wherein prior to depositing the second metal layer a dielectric layer is deposited over the first electrode and the anchor location.

3. The method according to claim 2, further comprising after depositing the dielectric layer, depositing a thin metal layer, the thin metal layer comprising Hafnium.

4. The method according to claim 1, wherein the second metal layer comprises aluminum or an aluminum alloy, and wherein the creating the first and second metal bodies includes:

oxidizing the surface of the second metal layer to form an oxidized surface;

applying a patterning mask on the oxidized surface, such that a first mask portion and second mask portion are located over and cover areas of the second metal layer where the first and second metal body are to be created;

anodizing the second metal layer in areas not covered by the first and second mask portions, causing the first and second metal bodies to be enveloped at their respective side walls and top surface by anodized metal and causing the intermediate separation to comprise anodized metal.

5. The method according to claim 4, further comprising removing the oxidized surface above the first metal body prior to the creation of the beam-shaped body located on the first metal body and at least a portion of the second metal body.

6. The method according to claim 4, further comprising creating a first protective layer on the beam-shaped body.

7. The method according to claim 6, further comprising, after creating the first protective layer, creating an opening by a contact etch in the first protective layer to the second metal body.

8. The method according to claim 2, further comprising forming the intermediate separation of the first and second metal bodies as a trench by anisotropic etching.

9. The method according to claim 8, further comprising depositing a second protective layer on at least the first and second metal bodies prior to the creation of the second electrode.

10. The method according to claim 9, further comprising, following the deposition of the second protective layer, creating an opening by contact etching the second protective layer to the first metal body.

11. The method according to claim 9, further comprising, following the creation of the at least one opening in the third metal layer to the second metal body in an area above the second metal body, depositing a third protective layer that covers the beam-shaped body and sidewalls of the at least one opening in the third metal layer.

12. The method according to claim 10, further comprising, prior to depositing the second metal layer, depositing a metal-based layer as an additional protective layer over the dielectric layer that covers the first electrode, the metal-based layer being patterned to cover the dielectric layer substantially in the area of the second metal body and the trench.

13. The method according to claim 12, wherein the additional protective layer, the second protective layer, and the third protective layer each comprises a metal from the group of a titanium-tungsten alloy, a titanium-nitride alloy, a titanium-tungsten-nitride alloy, and a tantalum-nitride alloy.

14. The method according to claim 13, wherein the second protective layer in the trench and in a region adjacent to the trench on top of the first and second metal bodies is covered by a further metal layer.

15. The method according to claim 14, wherein the further metal layer comprises tungsten.

16. A MEMS element on a substrate comprising an insulating layer, the MEMS element comprising:

a first electrode and a second electrode, the first and second electrodes being separated by a cavity, the first electrode being arranged on the insulating surface layer of the substrate; and a first metal body adjacent to the first electrode and arranged as an anchor of the second electrode, wherein the second electrode is arranged as a beam-shaped body located on the first metal body and above the first electrode, and wherein the cavity is laterally demarcated by a dielectric covering a sidewall of the first metal body.

17. The MEMS element according to claim 16, wherein the first metal body comprises aluminum.

18. The MEMS element according to claim 17, wherein the dielectric comprises aluminum-oxide.

19. The MEMS element according to claim 16, wherein the dielectric covering the sidewall of the first metal body is covered by a metal layer, the metal layer including aluminum.

20. The MEMS element according to claim 16, wherein a constriction of the second electrode is located at a side of the first metal body opposite to the side where the cavity is located.

21. A MEMS element on a substrate comprising an insulating layer, the MEMS element comprising:

a first electrode and a second electrode, the first and second electrodes being separated by a cavity, the first electrode being arranged on the insulating surface layer of the substrate; and a first metal body adjacent to the first electrode and arranged as an anchor of the second electrode, wherein the second electrode is arranged as a beam-shaped body located on the first metal body and above the first electrode, and wherein at least a portion of the metal layer extends along a sidewall of the first metal body and is adjacent to the cavity.

22. The MEMS element according to claim 21, wherein the metal layer covering the sidewall includes titanium-tungsten, titanium nitride and tungsten, titanium-tungsten-nitride, or tantalum-nitride.

* * * * *